US007562451B2

(12) United States Patent
Ito et al.

(10) Patent No.: US 7,562,451 B2
(45) Date of Patent: Jul. 21, 2009

(54) METHOD OF MANUFACTURING ACTUATOR DEVICE FOR INK JET HEAD

(75) Inventors: Maki Ito, Nagano-ken (JP); Masami Murai, Nagano-ken (JP); Xin-Shan Li, Nagano-ken (JP); Toshinao Shinbo, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 173 days.

(21) Appl. No.: 10/582,112

(22) PCT Filed: Dec. 9, 2004

(86) PCT No.: PCT/JP2004/018378

§ 371 (c)(1), (2), (4) Date: Jun. 8, 2006

(87) PCT Pub. No.: WO2005/056295

PCT Pub. Date: Jun. 23, 2005

(65) Prior Publication Data

US 2007/0084033 A1 Apr. 19, 2007

(30) Foreign Application Priority Data

Dec. 9, 2003 (JP) ............................. 2003-410724
Aug. 6, 2004 (JP) ............................. 2004-231463

(51) Int. Cl.
*B23P 17/00* (2006.01)
*H01L 41/00* (2006.01)
*H03H 9/00* (2006.01)

(52) U.S. Cl. .................... 29/890.1; 29/25.35; 29/25.42; 29/830; 29/831; 29/832; 347/68; 310/328; 333/193

(58) Field of Classification Search ................ 29/25.35, 29/25.42, 890.1, 830, 831, 832; 310/328, 310/311, 313 A, 313 B; 333/193; 347/68-70, 347/71, 72
See application file for complete search history.

(56) References Cited

U.S. PATENT DOCUMENTS 5,802,686 A * 9/1998 Shimada et al. ............ 29/25.35

(Continued)

FOREIGN PATENT DOCUMENTS

JP 6-297720 A 10/1994

(Continued)

*Primary Examiner*—Minh Trinh
*Assistant Examiner*—Tai Nguyen
(74) *Attorney, Agent, or Firm*—Sughrue Mion, PLLC

(57) ABSTRACT

A method of manufacturing an actuator device configured to prevent separation of a vibration plate and to enhance durability and reliability, and a liquid-jet apparatus are provided. The method includes the steps of forming a vibration plate on one surface of a substrate, and forming a piezoelectric element having a lower electrode, a piezoelectric layer, and an upper electrode on the vibration plate. The step of forming a vibration plate at least includes an insulation film forming step of forming an insulation film made of zirconium oxide by forming a zirconium layer on the one surface side of the substrate in accordance with a sputtering method and subjecting the zirconium layer to thermal oxidation by inserting the substrate formed with the zirconium layer to a thermal oxidation furnace heated to a temperature greater than or equal to 700° C. at a speed greater than or equal to 200 mm/min.

9 Claims, 13 Drawing Sheets

U.S. PATENT DOCUMENTS 6,268,258 B1 * 7/2001 Joo et al. .................... 438/381
6,328,433 B1 * 12/2001 Moriya et al. ................. 347/68
6,378,996 B1 * 4/2002 Shimada et al. ............... 347/70

FOREIGN PATENT DOCUMENTS

JP 9-254386 A 9/1997
JP 11-204849 A 7/1999
JP 2002-64092 A 2/2002
JP 2002-240297 A 8/2002

* cited by examiner (a)

(b)

(a)

(b)

(c)

(d)

(a)

(b)

(a)

Sample 10

(b)

Sample 11

(c)

Sample 12

METHOD OF MANUFACTURING ACTUATOR DEVICE FOR INK JET HEAD

TECHNICAL FIELD

The present invention relates to a method of manufacturing an actuator device configured to construct part of a pressure generating chamber-by use of a vibration plate, to form a piezoelectric element having a piezoelectric layer above this vibration plate, and to deform the vibration plate by displacement of the piezoelectric element, and relates to a liquid-jet apparatus for ejecting droplets by use of the actuator device.

BACKGROUND ART

An actuator device including a piezoelectric element configured to be displaced by application of a voltage is used as liquid ejecting means of a liquid-jet head mounted on a liquid-jet apparatus for injecting droplets, for example. As for the liquid-jet apparatus described above, there is known an inkjet recording device including an inkjet recording head, which is configured to construct part of a pressure generating chamber communicating with a nozzle orifice by use of a vibration plate, to pressurize ink in the pressure generating chamber by deforming this vibration plate with a piezoelectric element, and thereby to eject ink droplets out of a nozzle orifice.

Two types of inkjet recording heads are put into practical use, namely, one mounting an actuator device of a longitudinal vibration mode configured to expand and contract in an axial direction of a piezoelectric element, and one mounting an actuator device of a flexural vibration mode. Moreover, as the one applying the actuator device of the flexural vibration mode, there is one configured to form a uniform piezoelectric film across the entire surface of the vibration plate in accordance with a film forming technique, and to form piezoelectric elements independently of respective pressure generating chambers by cutting this piezoelectric layer into shapes corresponding to the pressure generating chambers in accordance with a lithography method, for example.

As a material of a piezoelectric material layer constituting such piezoelectric elements, lead zirconate titanate (PZT) is used, for example. In this case, when sintering the piezoelectric material layer, a lead component of the piezoelectric material layer is diffused into a silicon oxide ($SiO_2$) film, which is provided on a surface of a passage-forming substrate made of silicon (Si) for constituting the vibration plate. Accordingly, there is a problem that the melting point of silicon oxide drops by diffusion of this lead component and silicon oxide melts away owing to the heat at the time of backing the piezoelectric material layer. To solve this problem, for example, there is a technique configured to construct a vibration plate on a silicon oxide film, to provide a zirconium oxide film having a predetermined thickness, to provide a piezoelectric material layer on this zirconium oxide layer, and thereby to prevent diffusion of a lead component from the piezoelectric material layer into the silicon oxide film (see Patent Document 1, for example).

This zirconium oxide film is formed for instance by forming a zirconium film in accordance with a sputtering method and then subjecting this zirconium layer to thermal oxidation. For this reason, there is a problem of occurrence of defects, such as occurrence of cracks on the zirconium oxide film due to stress generated at the time of subjecting the zirconium film to thermal oxidation. Meanwhile, if a large difference in stress exists between the passage-forming substrate and the zirconium oxide film, there also occurs a problem that the zirconium film comes off after forming the pressure generating chambers on the passage-forming substrate, for example, due to deformation of the passage-forming substrate and the like. Patent Document 1: Japanese Unexamined Patent Publication No. 11(1999) - 204849 (FIG. 1, FIG. 2, p. 5)

DISCLOSURE OF THE INVENTION

Problems to be Solved by the Invention

A first aspect of the present invention for solving the above-described problems is a method of manufacturing an actuator device including the steps of forming a vibration plate on one surface of a substrate, and forming a piezoelectric element having a lower electrode, a piezoelectric layer, and an upper electrode on the vibration plate. Here, the step of forming the vibration plate at least includes an insulation film forming step of forming an insulation film made of zirconium oxide by forming a zirconium layer above the one surface side of the substrate in accordance with a sputtering method and subjecting the zirconium layer to thermal oxidation by inserting the substrate formed with the zirconium layer to a thermal oxidation furnace heated to a temperature greater than or equal to 700° C. at a speed greater than or equal to 200 mm/min.

According to the first aspect, it is possible to enhance adhesion of the insulation film and to prevent occurrence of separation of the insulation film, and the like.

A second aspect of the present invention is the method of manufacturing an actuator device according to the first aspect, in which the temperature for heating the thermal oxidation furnace is set in a range from 850° C. to 1000° C.

According to the second aspect, it is possible to suppress an increase in stress of the insulation film by setting a relatively high temperature for heating the thermal oxidation furnace, and thereby to prevent occurrence of cracks on the insulation film which is attributable to the stress.

A third aspect of the present invention is the method of manufacturing an actuator device according to the first or second aspect, in which a rate of temperature increase of the zirconium layer upon insertion of the substrate into the thermal oxidation furnace is set greater than or equal to 300° C./min.

According to the third aspect, it is possible to suppress an increase in stress of the insulation film more reliably by setting a relatively fast rate of temperature increase of the zirconium layer, and to increase a density of the insulation film.

A fourth aspect of the present invention is the method of manufacturing an actuator device according to the third aspect, in which a density of the insulation film is set greater than or equal to 5.0 $g/cm^3$ in the insulation film forming step.

According to the fourth aspect, the insulation film is formed into a dense film. Therefore, it is possible to suppress diffusion of a lead (Pb) component of the piezoelectric layer into an elastic film effectively.

A fifth aspect of the present invention is the method of manufacturing an actuator device according to any of the first to fourth aspects, in which a film thickness of the insulation film is set greater than or equal to 40 nm in the step of forming the insulation film.

According to the fifth aspect, it is possible to suppress diffusion of the lead (Pb) component of the piezoelectric layer into the elastic film reliably.

A sixth aspect of the present invention is a method of manufacturing an actuator device including the steps of forming a vibration plate above one surface of a substrate, and forming a piezoelectric element having a lower electrode, a piezoelectric layer, and an upper electrode above the vibration plate. Here, the step of forming the vibration plate at least includes the steps of forming an insulation film made of zirconium oxide layer by forming a zirconium layer above the one surface side of the substrate and subjecting the zirconium layer to thermal oxidation while heating the zirconium layer up to a predetermined temperature at a predetermined rate of temperature increase, and adjusting stress of the insulation film by annealing the insulation film at a temperature less than or equal to a maximum temperature in thermal oxidation of the zirconium layer.

According to the sixth aspect, adhesion of the insulation film constituting the vibration plate is enhanced. Moreover, it is also possible to suppress unevenness in adhesion of the insulation film in the same wafer, and to manufacture an actuator device having a uniform displacement characteristic of the piezoelectric element.

A seventh aspect of the present invention is the method of manufacturing an actuator device according to the sixth aspect, in which the rate of temperature increase upon thermal oxidation of the zirconium layer is set greater than or equal to 5° C./sec.

According to the seventh aspect, it is possible to further enhance the adhesion of the insulation film. Moreover, since the density of the insulation film is increased, it is possible to suppress diffusion of the lead (Pb) component of the piezoelectric layer into the elastic film.

An eighth aspect of the present invention is the method of manufacturing an actuator device according to the seventh aspect, in which the rate of temperature increase upon thermal oxidation of the zirconium layer is set greater than or equal to 50° C./sec.

According to the eighth aspect, the insulation film is formed into a denser film by setting the rate of temperature increase greater than or equal to the predetermined value, and the adhesion of the insulation film is enhanced reliably.

A ninth aspect of the present invention is the method of manufacturing an actuator device according to the eighth aspect, in which the zirconium layer is heated by an RTA method upon thermal oxidation of the zirconium layer.

According to the ninth aspect, it is possible to heat the zirconium layer at a desired rate of temperature increase by use of the RTA method.

A tenth aspect of the present invention is the method of manufacturing an actuator device according to any of the seventh to tenth aspects, in which a density of the insulation film is set greater than or equal to 5.0 g/cm$^3$ in the step of forming the insulation film.

According to the tenth aspect, the insulation film is formed into a dense film. Therefore, it is possible to suppress diffusion of a lead (Pb) component of the piezoelectric layer into an elastic film effectively.

An eleventh aspect of the present invention is the method of manufacturing an actuator device according to the tenth aspect, in which a film thickness of the insulation film is set greater than or equal to 40 nm in the step of forming the insulation film.

According to the eleventh aspect, it is possible to suppress diffusion of the lead (Pb) component of the piezoelectric layer into the elastic film reliably.

A twelfth aspect of the present invention is the method of manufacturing an actuator device according to any of the sixth to eleventh aspects, in which a temperature upon thermal oxidation of the zirconium layer is set in a range from 800° C. to 1000° C.

According to the twelfth aspect, it is possible to subject the zirconium layer to thermal oxidation favorably, and to enhance the adhesion of the insulation film more reliably.

A thirteenth aspect of the present invention is the method of manufacturing an actuator device according to the twelfth aspect, in which a temperature upon annealing the insulation film is set in a range from 800° C. to 900° C.

According to the thirteenth aspect, it is possible to adjust the stress of the insulation film without reducing the adhesion.

A fourteenth aspect of the present invention is the method of manufacturing an actuator device according to the thirteenth aspect, in which a time period for annealing the insulation film is adjusted in a range from 0.5 hours to 2 hours.

According to the fourteenth aspect, it is possible to adjust the stress of the insulation film reliably without reducing the adhesion.

A fifteenth aspect of the present invention is the method of manufacturing an actuator device according to any of the first to fourteenth aspects, in which the step of forming the vibration plate includes the step of forming an elastic film made of silicon oxide ($SiO_2$) above the one surface of the substrate made of a single crystal silicon substrate. Here, the insulation film is formed above the elastic film.

According to the fifteenth aspect, the adhesion is enhanced even when the film below the insulation film is the elastic film made of silicon oxide.

A sixteenth aspect of the present invention is the method of manufacturing an actuator device according to any of the first to fifteenth aspects, in which the step of forming a piezoelectric element at least includes the step of forming a piezoelectric layer made of lead zirconate titanate (PZT) above the vibration plate.

According to the sixteenth aspect, it is possible to prevent diffusion of the lead component of the piezoelectric layer into the vibration plate, and thereby to form the vibration plate and the piezoelectric element favorably.

A seventeenth aspect of the present invention is a liquid-jet apparatus, which includes a liquid-jet head applying the actuator device manufactured by the method according to any of the first to sixteenth aspects as liquid ejecting means.

According to seventeenth aspect, it is possible to enhance durability of the vibration plate and to enhance an amount of displacement of the vibration plate by a drive of the piezoelectric element. Hence it is possible to realize the liquid-jet apparatus having an enhanced droplet ejecting characteristic.

Figure 1:
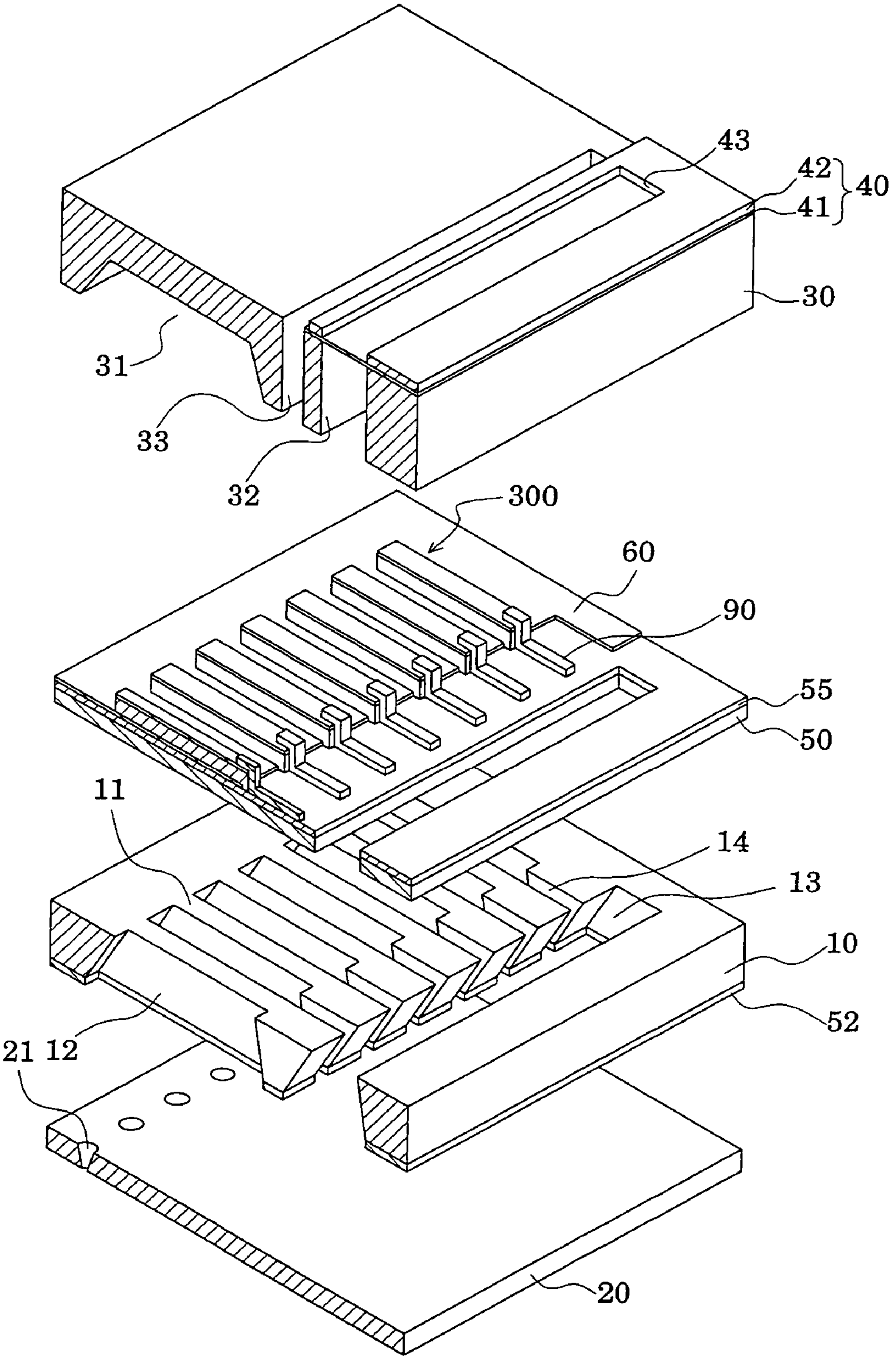
FIG. 1 is an exploded perspective view of a recording head according to Embodiment 1.

| EXPLANATION OF REFERENCE NUMERALS | |
|---|---|
| 10 | PASSAGE-FORMING SUBSTRATE |
| 12 | PRESSURE GENERATING CHAMBER |
| 20 | NOZZLE PLATE |
| 21 | NOZZLE ORIFICE |
| 30 | PROTECTIVE PLATE |
| 31 | PIEZOELECTRIC ELEMENT HOLDING PORTION |
| 32 | RESERVOIR PORTION |
| 40 | COMPLIANCE PLATE |
| 50 | ELASTIC FILM |
| 55 | INSULATION FILM |
| 60 | LOWER ELECTRODE FILM |
| 70 | PIEZOELECTRIC LAYER |
| 80 | UPPER ELECTRODE FILM |
| 100 | RESERVOIR |
| 110 | PASSAGE-FORMING SUBSTRATE WAFER |
| 300 | PIEZOELECTRIC ELEMENT |

BEST MODES FOR CARRYING OUT THE INVENTION

The present invention will be described below in detail based on embodiments.

Embodiment 1

Figure 2:
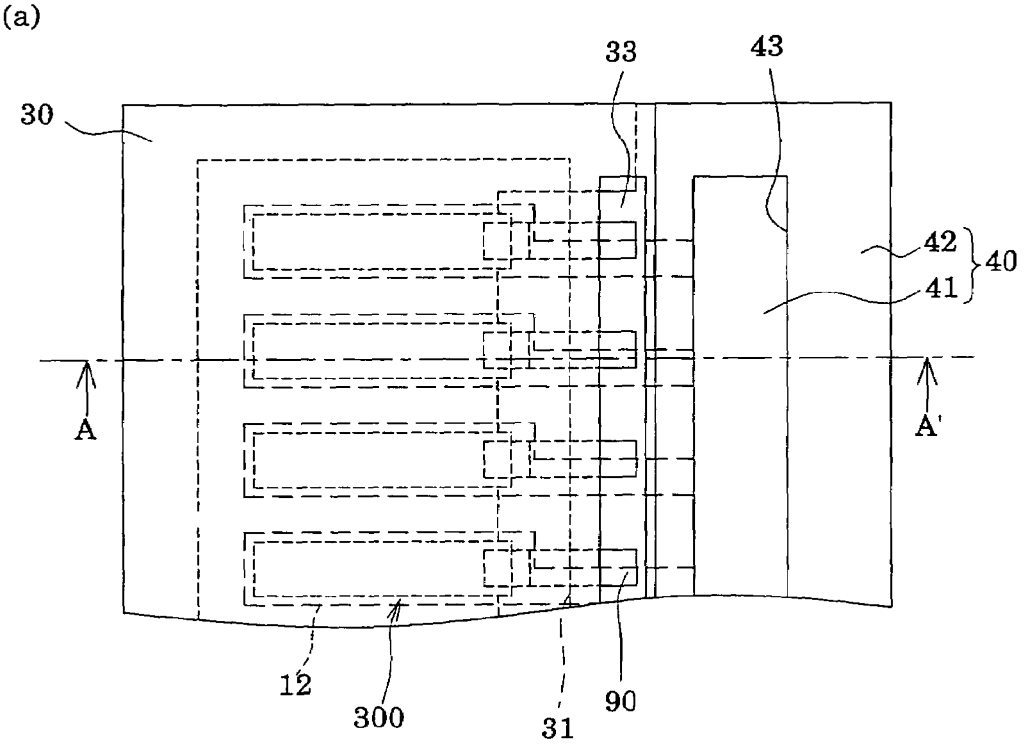
FIG. 2(*a*) is a plan view and FIG. 2(*b*) is a cross-sectional view of the recording head according to Embodiment 1.
Figure 2:
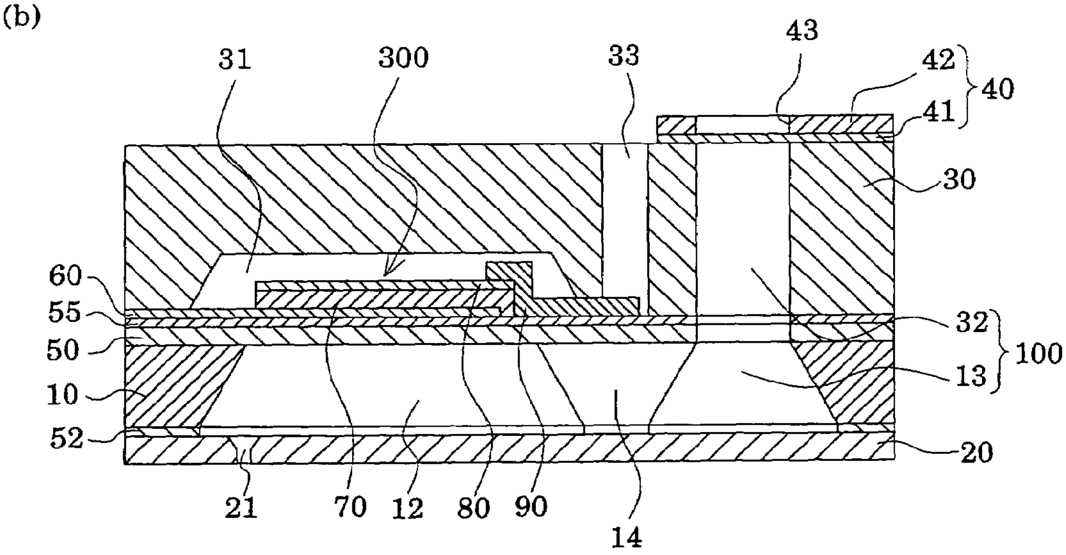

FIG. 1 is an exploded perspective view showing an inkjet recording head according to Embodiment 1 of the present invention. FIG. 2(*a*) is a plan view and FIG. 2(*b*) is a cross-sectional view of FIG. 1. As shown in the drawings, a passage-forming substrate 10 is made of a single crystal silicon substrate having a (110) plane orientation in this embodiment, and an elastic film 50, which is made of silicon dioxide and formed in advance by thermal oxidation, is formed in a thickness from 0.5 to 2 μm on one surface thereof. On the passage-forming substrate 10, a plurality of pressure generating chambers 12 are arranged in a width direction thereof. Moreover, a communicating portion 13 is formed in a region outside in a longitudinal direction of the pressure generating chambers 12 of the passage-forming substrate 10, and the communicating portion 13 communicates with the respective pressure generating chambers 12 through ink supply paths 14 provided for the respective pressure generating chambers 12. Here, the communicating portion 13 constitutes part of a reservoir, which communicates with a reservoir portion of a protective plate to be described later and forms a common ink chamber to the respective pressure generating chambers 12. The ink supply paths 14 are formed in a narrower width than the pressure generating chambers 12, and maintain constant passage resistance of ink flowing from the communicating portion 13 into the pressure generating chambers 12.

Meanwhile, a nozzle plate 20, on which nozzle orifices 21 for communicating with the vicinity of an end portion on an opposite side to the ink supply paths 14 of the respective pressure generating chambers 12 are drilled, is fixed to an opening surface side of the passage-forming substrate 10 through an adhesive, a thermowelding film or the like. Here, the nozzle plate 20 is made of a glass ceramic having a thickness in a range from 0.01 to 1 mm, for example, and a coefficient of linear expansion in a range from 2.5 to 4.5 [$\times 10^{-6}$/° C.] at a temperature less than or equal to 300° C., for example, a single crystal silicon substrate, stainless steel or the like.

In the meantime, as described previously, the elastic film 50 made of silicon dioxide ($SiO_2$) in the thickness of about 1.0 μm, for example, is formed on the opposite side to the opening surface of this passage-forming substrate 10, and an insulation film 55 made of zirconium oxide ($ZrO_2$) in a thickness of about 0.4 μm, for example, is formed on this elastic film 50. Moreover, a lower electrode film 60 in a thickness of about 0.2 μm, for example, a piezoelectric layer 70 in a thickness of about 1.0 μm, for example, and an upper electrode film 80 in a thickness of about 0.05 μm, for example, are formed by lamination in a process to be described later on this insulation film 55, thereby constituting a piezoelectric element 300. Here, the piezoelectric element 300 means the portion including the lower electrode film 60, the piezoelectric layer 70, and the upper electrode film 80. In general, one of the electrodes of the piezoelectric element 300 is used as a common electrode; meanwhile, the other electrode and the piezoelectric layer 70 are patterned for each of the pressure generating chambers 12. Moreover, the portion including one of the electrodes and the piezoelectric layer 70 thus patterned and configured to cause a piezoelectric strain by application of a voltage to the both electrodes is herein referred to as a piezoelectric active portion. In this embodiment, the lower electrode film 60 is used as the common electrode to the piezoelectric elements 300 and the upper electrode film 80 is used as an individual electrode of the piezoelectric element 300. However, there is no problem if this configuration is inverted on grounds of a driving circuit or wiring. In any case, the piezoelectric active portion will be formed for each of the pressure generating chambers. Moreover, the piezoelectric element 300 and the vibration plate causing displacement by a drive of the piezoelectric element 300 are herein collectively referred to as a piezoelectric actuator. Note that lead electrodes 90 made of gold (Au), for example, are connected to the upper electrode films 80 of the respective piezoelectric elements 300 described above, and a voltage is selectively applied to the respective piezoelectric elements 300 through these lead electrodes 90.

Meanwhile, a protective plate 30 having a piezoelectric element holding portion 31, which is capable of securing an adequate space in a region facing the piezoelectric elements 300 so as not to inhibit movement thereof, is bonded to a surface of the passage-forming substrate 10 on the side of the piezoelectric elements 300. The piezoelectric elements 300 are formed inside this piezoelectric element holding portion 31, and are therefore protected in a state virtually insusceptible to influences of an external environment. In addition, the protective plate 30 is provided with a reservoir portion 32 in a region corresponding to the communicating portion 13 of the passage-forming substrate 10. In this embodiment, this reservoir portion 32 is provided along the direction of arrangement of the pressure generating chambers 12 while penetrating the protective plate 30 in the thickness direction, communicates with the communicating portion 13 of the passage-forming substrate 10, and thereby constitutes a reservoir 100 which forms the common ink chamber to the respective pressure generating chambers 12 as described previously.

Meanwhile, a through hole 33 penetrating the protective plate 30 in the thickness direction is provided in a region of the protective plate 30 between the piezoelectric element holding portion 31 and the reservoir portion 32. Part of the lower electrode film 60 and tip portions of the lead electrodes 90 are exposed in this through hole 33. Although it is not illustrated in the drawing, one end of a connection line extending from a driver IC is connected to the lower electrode film 60 and to the lead electrodes 90.

Here, the material of the protective plate 30 may include glass, a ceramic material, metal, resin, and the like, for example. However, it is preferable to form the protective plate 30 by use of a material having a substantially identical thermal expansion coefficient as that of the passage-forming substrate 10. In this embodiment, the protective plate 30 was formed by use of a single crystal silicon substrate which was the same material as the passage-forming substrate 10.

Moreover, a compliance plate 40 including a sealing film 41 and a fixation plate 42 is bonded onto the protective plate 30. The sealing film 41 is made of a low-rigidity material having flexibility (such as a polyphenylene sulfide (PPS) film having a thickness of 6 μm, for example), and one surface of the reservoir portion 32 is sealed with this sealing film 41. Meanwhile, the fixation plate 42 is formed of a hard material such as metal (stainless steel (SUS) in a thickness of 30 μm, for example). A region of this fixation plate 42 facing the reservoir 100 is entirely removed in the thickness direction and is formed into an open portion 43. Accordingly, the one surface of the reservoir 100 is sealed only with the sealing film 41 having flexibility.

In the above-described inkjet recording head of this embodiment, ink is loaded from unillustrated external ink supplying means. After the inside ranging from the reservoir 100 to the nozzle orifices 21 is filled with the ink, a voltage is applied between the lower electrode film 60 and the upper electrode film 80 corresponding to each of the pressure generating chambers 12 in accordance with a recording signal from the unillustrated driver IC so as to subject the elastic film 50, the insulation film 55, the lower electrode film 60, and the piezoelectric layer 70 to flexural deformation, whereby pressure inside the respective pressure generating chambers 12 is increased and ink droplets are ejected from the nozzle orifices 21.

Figure 3:
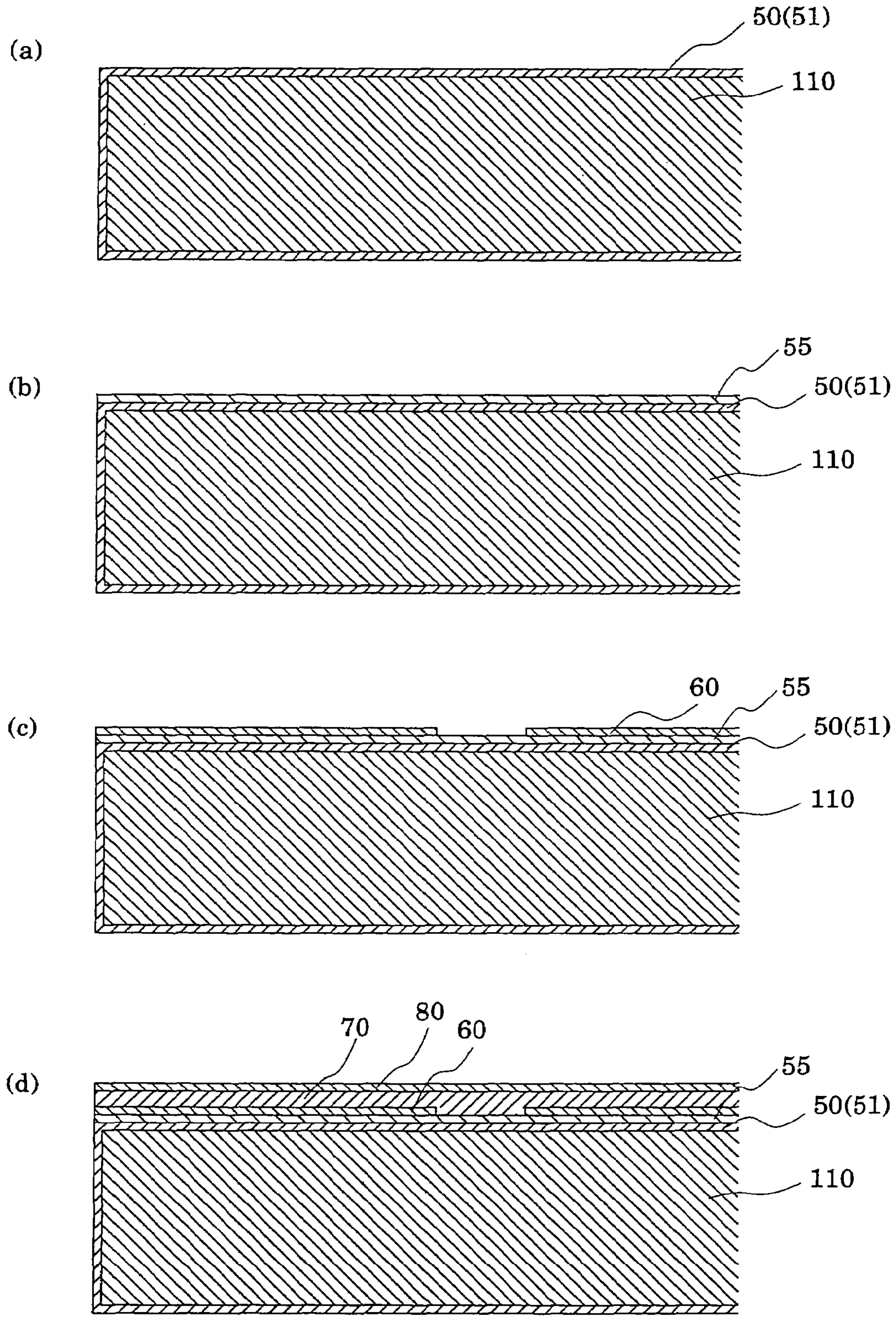
FIGS. 3(*a*) to 3(*d*) are cross-sectional views showing a manufacturing process of the recording head according to Embodiment 1.
Figure 5:
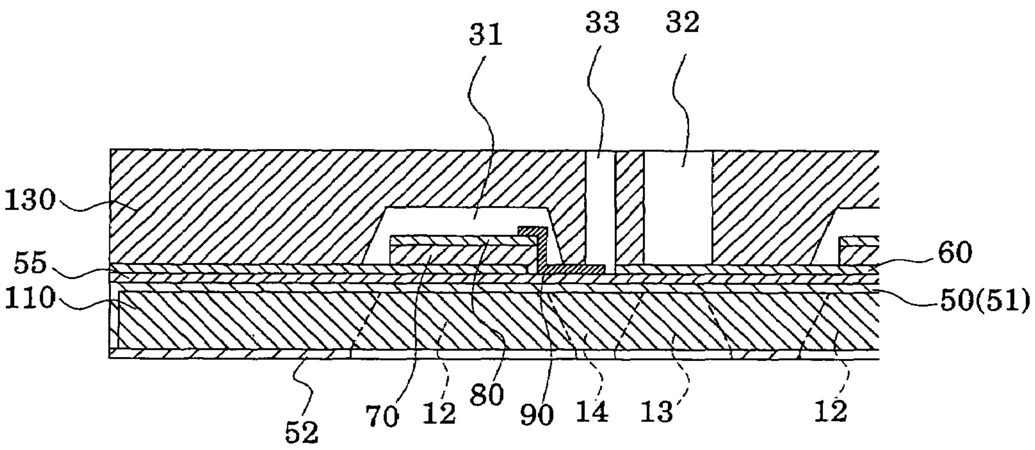
FIGS. 5(*a*) and 5(*b*) are cross-sectional views showing the manufacturing process of the recording head according to Embodiment 1.
Figure 5:
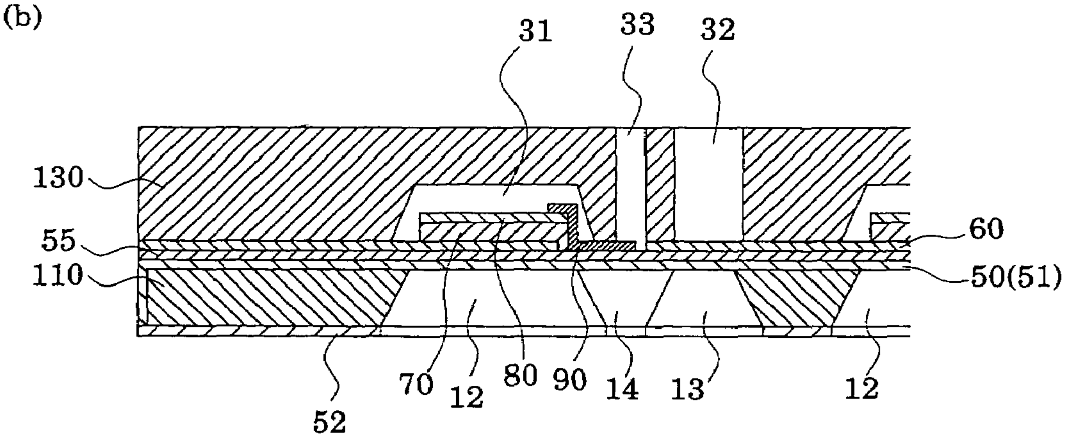

Here, a method of manufacturing the above-described inkjet recording head will be explained with reference to FIG. 3(*a*) to FIG. 5(*b*). Note that FIG. 3(*a*) to FIG. 5(*b*) are cross-sectional views of the pressure generating chamber 12 taken in the longitudinal direction. Firstly, as shown in FIG. 3(*a*), a passage-forming substrate wafer 110 which is a silicon wafer is subjected to thermal oxidation in a diffusion furnace at about 1100° C., and a silicon dioxide film 51 constituting the elastic film 50 is formed on a surface thereof. Here, in this embodiment, a high-rigidity silicon wafer having a relatively large film thickness of about 625 μm is used as the passage-forming substrate wafer 110.

Subsequently, as shown in FIG. 3(*b*), the insulation film 55 made of zirconium oxide is formed on the elastic film 50 (the silicon dioxide film 51). To be more precise, a zirconium layer in a predetermined thickness, which is equal to about 300 nm in this embodiment, is formed on the elastic film 50 in accordance with a DC sputtering method, for example. Then, the passage-forming substrate wafer 110 formed with the zirconium layer is inserted into a thermal diffusion furnace heated greater than or equal to 700° C. at a speed greater than or equal to 200 mm/min to subject the zirconium layer to thermal oxidation, thereby forming the insulation film 55 made of zirconium oxide.

Figure 6:
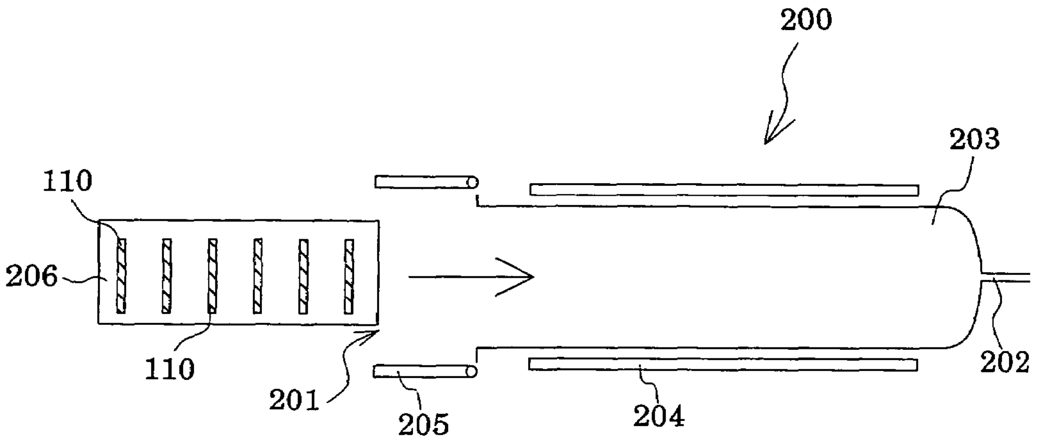
FIG. 6 is a schematic drawing of a diffusion furnace used in the manufacturing process.

As shown in FIG. 6, a diffusion furnace 200 used for thermal oxidation of the zirconium layer includes a core tube 203 having a throat 201 on one end side and an introducing port 202 for reactive gas on the other end, and a heater 204 disposed outside the core tube 203, for example. The throat 201 can be opened and closed by a shutter 205. Moreover, in this embodiment, multiple pieces of the passage-forming substrate wafers 110 formed with the zirconium layers are fixed to a boat 206 which is a fixing-member, then this boat 206 is inserted into the diffusion furnace 200 heated to about 900° C. at a speed greater than or equal to 200 mm/min, and then the zirconium layers are subjected to thermal oxidation for about one hour while closing the shutter 205 to form the insulation films 55.

The speed of insertion of this boat 206. (hereinafter, a boat load speed) at least needs to be faster than 200 mm/min, but is preferably set greater than or equal to 500 mm/min. Meanwhile, a rate of temperature increase of the zirconium layer when inserting the passage-forming substrate wafer 110 into the diffusion furnace 200 is preferably set greater than or equal to 300° C./min. For this reason, it is preferable to adjust the boat load speed appropriately in response to a heating temperature of the diffusion furnace 200 so as to establish this rate of temperature increase.

The passage-forming substrate wafer 110 formed with the zirconium layer as described above is inserted into the diffusion furnace 200 heated greater than or equal to 700° C. at the boat load speed faster than 200 mm/min in order to subject the zirconium layer to thermal oxidation. Hence, it is possible to form the insulation film 55 into a dense film, and to prevent occurrence of cracks on the insulation film 55. Moreover, since adhesion of the insulation film 55 is enhanced, it is possible to prevent separation of the insulation film 55 even in the case of repetitive deformation by the drive of the piezoelectric element 300.

Figure 7:
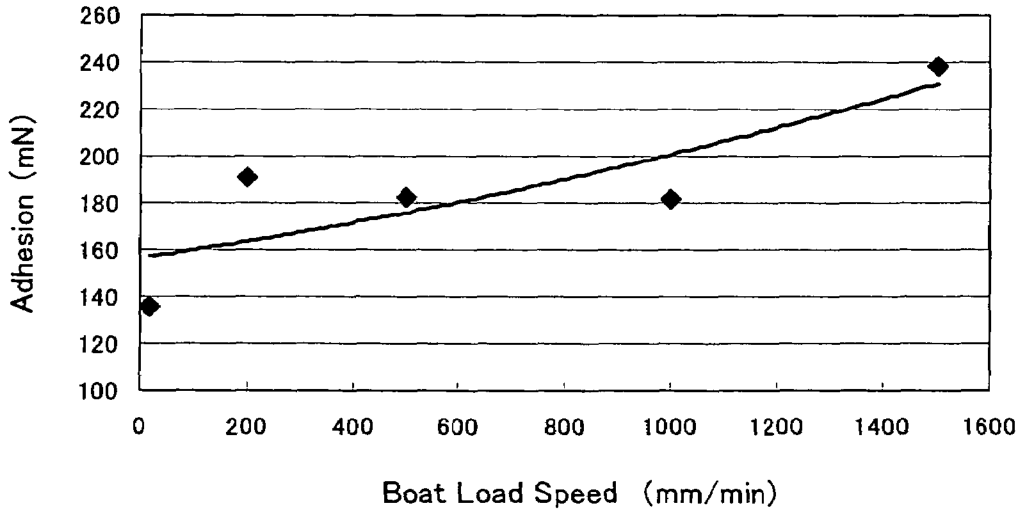
FIG. 7 is a graph showing a relation between a boat load speed and adhesion.

Here, zirconium oxide layers (the insulation films) were formed by changing the boat load speed in a range from 20 mm/min to 1500 mm/min while maintaining the diffusion furnace 200 at a constant temperature of about 900° C., and adhesion was investigated by performing scratch tests on these zirconium oxide layers. The result is shown in FIG. 7. As shown in FIG. 7, the adhesion of the zirconium oxide layers (the insulation films) was increased along with an increase in the boat load speed. When the boat load speed was greater than 200 mm/min, the adhesion at least greater than or equal to 150 mN was obtained. As it is apparent from this result, it is preferable to set the boat load speed as fast as possible in order to obtain the adhesion of the insulation film 55. However, it is possible to form the insulation film 55 having sufficient adhesion if the boat load speed is greater than 200 mm/min.

Meanwhile, the heating temperature of the diffusion surface 200 is not particularly limited as long as the temperature is set greater than or equal to 700° C. However, it is preferable to set the temperature in a range from 850° C. to 1000° C. By setting the heating temperature of the diffusion furnace 200 in this temperature range, stress of the insulation film 55 becomes weak in tensile stress, or more precisely, stress in a range from about −100 MPa to −250 MPa, which is balanced with stress of other films such as the elastic film 50. Accordingly, it is possible to prevent occurrence of cracks attributable to the stress of the insulation film 55, separation of the insulation film 55, and the like.

Figure 8:
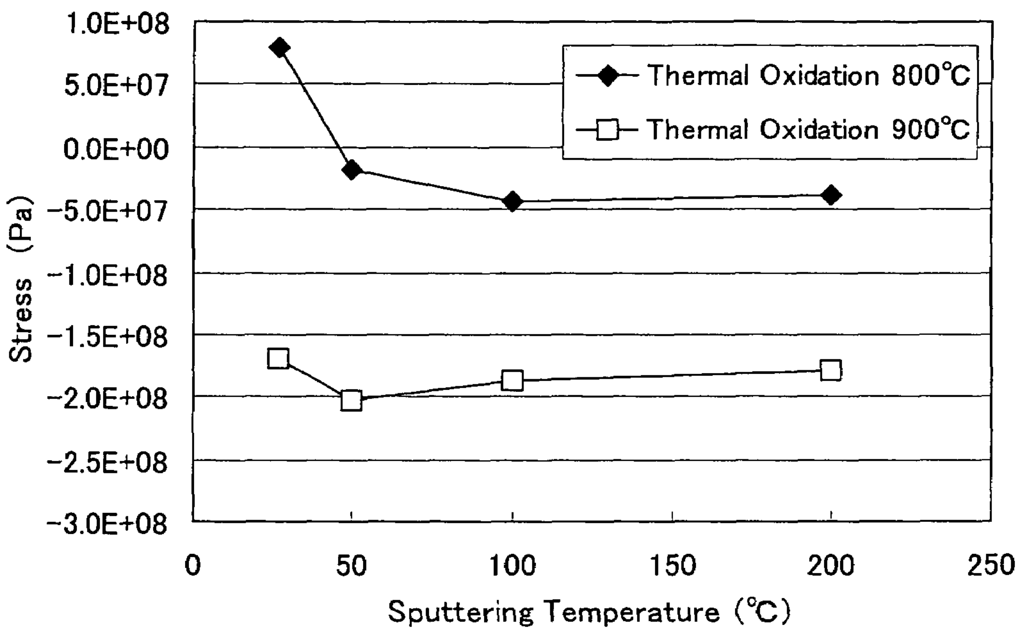
FIG. 8 is a graph showing a relation between a thermal oxidation temperature and stress.

Here, variation in the stress of the zirconium oxide layers (the insulation layers) when forming the zirconium layers, which were formed at different sputtering temperatures, at different thermal oxidation temperatures was investigated. The result is shown in FIG. 8. Note that the boat load speed in this case was stabilized at 500 mm/min. As shown in FIG. 8, when the thermal oxidation temperature was set to 900° C., the stress of the zirconium oxide layers was around −200 MPa irrespective of the sputtering temperature upon formation of the zirconium layers. On the contrary, when the thermal oxidation temperature was set to about 800° C., the stress of the zirconium oxide layers was around one-fourth (about −50 MPa) as compared to the case of setting the thermal oxidation temperature to 900° C.

As described above, the stress of the zirconium oxide layer (the insulation film) is also influenced slightly by the sputtering temperature, but varies largely depending on the thermal oxidation temperature. That is, the tensile stress tends to become larger as the thermal oxidation temperature is set higher. Moreover, when the thermal oxidation temperature (the temperature of the diffusion furnace) is set in the range from about 850° C. to 1000° C., the stress of the insulation film 55 is set to the range from about −100 MPa to −250 MPa.

Figure 9:
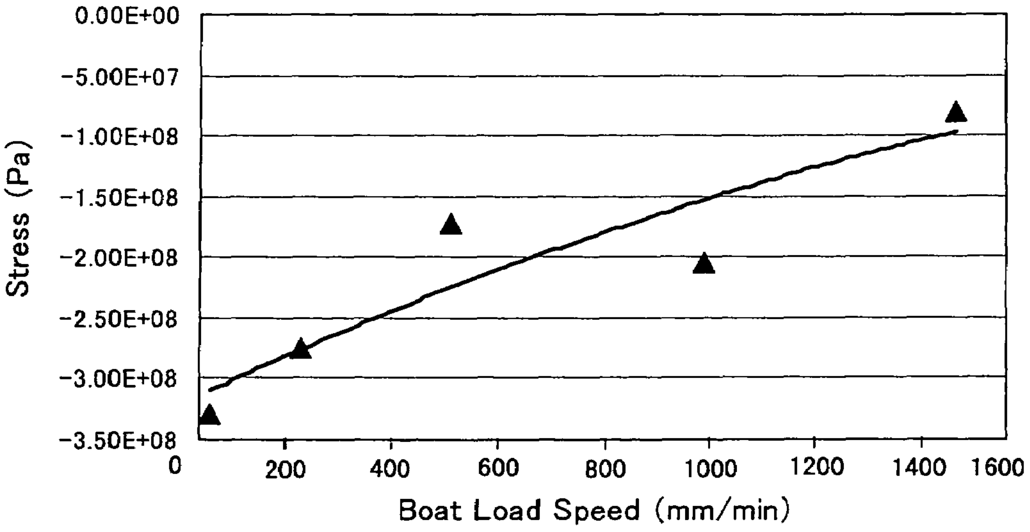
FIG. 9 is a graph showing a relation between the boat load speed and the stress.

Here, the thermal oxidation temperature (the temperature of the diffusion furnace) was stabilized at 900° C., and the stress of the zirconium oxidation layers (the insulation films) was further investigated while changing the boat load speed. The result is shown in FIG. 9. As shown in FIG. 9, it is obvious that the tensile stress of the zirconium oxide layer, tends to become smaller along with an increase in the boat load speed. Moreover, by setting the boat load speed faster than 200 mm/min, the stress of the zirconium oxide film (the insulation film) becomes greater than −250 MPa, or in other words, the tensile stress of the zirconium oxide layer becomes smaller than 250 MPa.

As described above, by setting the temperature of the diffusion furnace 200 in the range from about 850° C. to 1000° C. and setting the boat load speed faster than about 200 mm/min, it is possible to form the insulation film 55 into a dense and highly adhesive film. In addition, the stress of the insulation film 55 is set in the range from about −100 MPa to −250 MPa and is balanced with the stress of other films. Accordingly, it is possible to prevent occurrence of cracks on the insulation film 55 due to the stress, or separation of the insulation film 55 when forming the insulation film 55 or when forming the pressure generating chambers 12 in a process to be described later, and so forth.

Here, after forming the above-described insulation film 55, the lower electrode film 60 is formed by laminating platinum and iridium, for example, above the insulation film 55 as shown in FIG. 3(*c*), and then this lower electrode film 60 is patterned into a predetermined shape. Subsequently, as shown in FIG. 3(*d*), the piezoelectric layer 70 made of lead zirconate titanate (PZT), for example, and the upper electrode film 80 made of iridium, for example, are formed above the entire surface of the passage-forming substrate wafer 110. Here, in this embodiment, the piezoelectric layer 70 made of lead zirconate titanate (PZT) is formed by use of a so-called sol-gel method, which is configured to obtain the piezoelectric layer 70 made of a metal oxide by coating and drying a so-called sol including a metal-organic matter dissolved and dispersed in a catalyst into a gel, and then by sintering the gel at a high temperature. Here, when the piezoelectric layer 70 is formed as described above, there is a risk that a lead component of the piezoelectric layer 70 be dispersed into the elastic film 50 at the time of sintering. However, since the insulation film 55 made of zirconium oxide is provided below the piezoelectric layer 70, it is possible to prevent dispersion of the lead component of the piezoelectric layer 70 into the elastic film 50.

Here, as the material of the piezoelectric layer 70, it is also possible to use a relaxor ferroelectric material formed by adding metal such as niobium, nickel, magnesium, bismuth, yttrium or the like to a ferroelectric piezoelectric material such as lead zirconate titanate (PZT), for example. Although the composition may be selected appropriately in consideration of a characteristic, an application, and the like of the piezoelectric element, the composition may be $PbTiO_3$ (PT), $PbZrO_3$ (PZ), $Pb(Zr_x Ti_{1-x})O_3$(PZT), $Pb(Mg_{1/3}Nb_{2/3})O_3$—$PbTiO_3$ (PMN-PT), $Pb(Zn_{1/3}Nb_{2/3})O_3$—$PbTiO_3$ (PZN-PT), $Pb(Ni_{1/3}Nb_{2/3})O_3$—$PbTiO_3$(PNN-PT), $Pb(In_{1/2}Nb_{1/2})O_3$—$PbTiO_3$ (PIN-PT), $Pb(Sc_{1/3}Ta_{2/3})O_3$ —$PbTiO_3$(PST-PT), $Pb(Sc_{1/3}\ Nb_{2/3})O_3$—$PbTiO_3$(PSN-PT), $BiScO_3$—$PbTiO_3$ (BS-PT), $BiYbO_3$—$PbTiO_3$ (BY-PT), and the like, for example. Meanwhile, the method of manufacturing the piezoelectric layer 70 is not limited to the sol-gel method, and it is also possible to use a MOD (metal-organic decomposition) method, for example.

Figure 4:
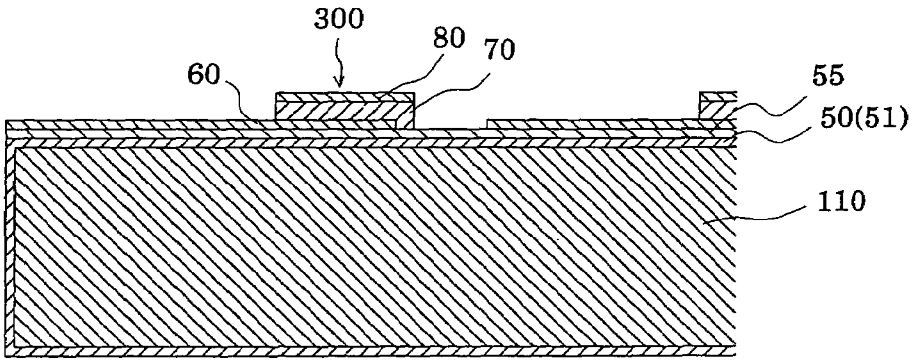
FIGS. 4(*a*) to 4(*d*) are cross-sectional views showing the manufacturing process of the recording head according to Embodiment 1.
Figure 4:
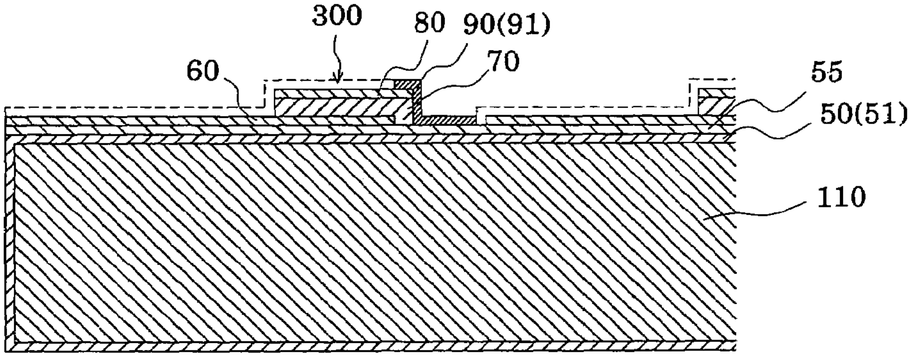
Figure 4:
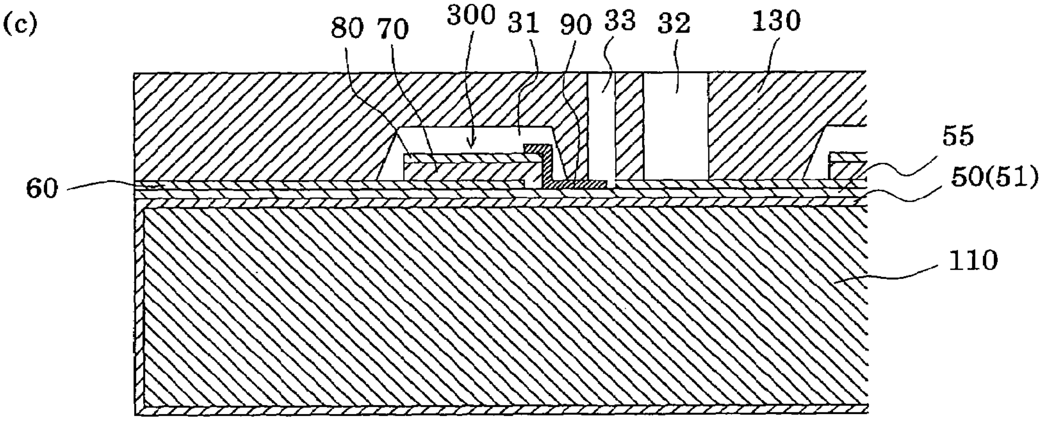
Figure 4:
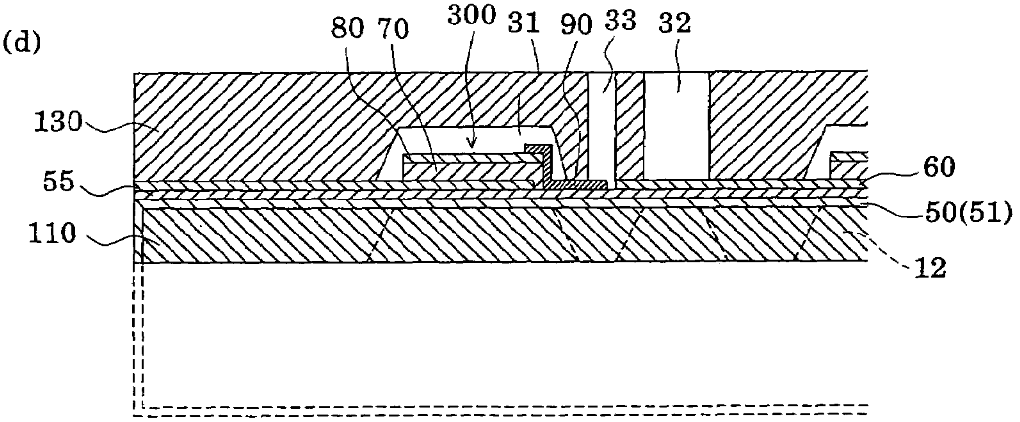

Subsequently, as shown in FIG. 4(*a*), the piezoelectric layer 70 and the upper electrode film 80 are patterned into regions so as to face the respective pressure generating chambers 12, thereby forming the piezoelectric elements 300. Next, the lead electrodes 90 are formed. To be more precise, as shown in FIG. 4(*b*), a metal layer 91 made of gold (Au) or the like, for example, is formed above the entire surface of the passage-forming substrate wafer 110. Thereafter, the lead electrodes 90 are formed by patterning the metal layer 91 for the respective piezoelectric element 300 through a mask pattern (not shown) made of resist or the like, for example.

Next, as shown in FIG. 4(*c*), a protective plate wafer 130, which is a silicon wafer for constituting a plurality of protective plates 30, is bonded to the passage-forming substrate wafer 110 on the side of the piezoelectric elements 300. Here, this protective plate wafer 130 has a thickness of about 400 μm, for example. Accordingly, rigidity of the passage-forming substrate wafer 110 is significantly enhanced by bonding the protective plate wafer 130.

Subsequently, as shown in FIG. 4(*d*), the passage-forming substrate wafer 110 is polished to a certain thickness, and then the passage-forming substrate wafer 110 is further formed into a predetermined thickness by wet etching with fluoronitric acid. For example, in this embodiment, the passage-forming substrate wafer 110 was subjected to an etching process so as to achieve a thickness of about 70 μm. Subsequently, as shown in FIG. 5(*a*), a mask film 52 made of silicon nitride (SiN), for example, is newly formed on the passage-forming substrate wafer 110 and is patterned into a predetermined shape. Then, by subjecting the passage-forming substrate wafer 110 to anisotropic etching through this mask film 52, the pressure generating chambers 12, the communicating portion 13, the ink supply paths 14, and the like are formed in the passage-forming substrate wafer 110 as shown in FIG. 5(*b*).

Thereafter, unnecessary portions on the outer peripheries of the passage-forming substrate wafer 110 and of the protective plate wafer 130 are cut out and removed by dicing, for example. Then, the nozzle plate 20 including the nozzle orifices 21 drilled thereon is bonded to the passage-forming substrate wafer 110 on the side opposite to the protective plate wafer 130, and the compliance plate 40 is bonded to the protective plate wafer 130. Then, the passage-forming substrate wafer 110 and the like are divided into the passage forming substrate 10 and the like in one chip size as shown in FIG. 1, thereby forming the inkjet recording head of this embodiment.

Figure 10:
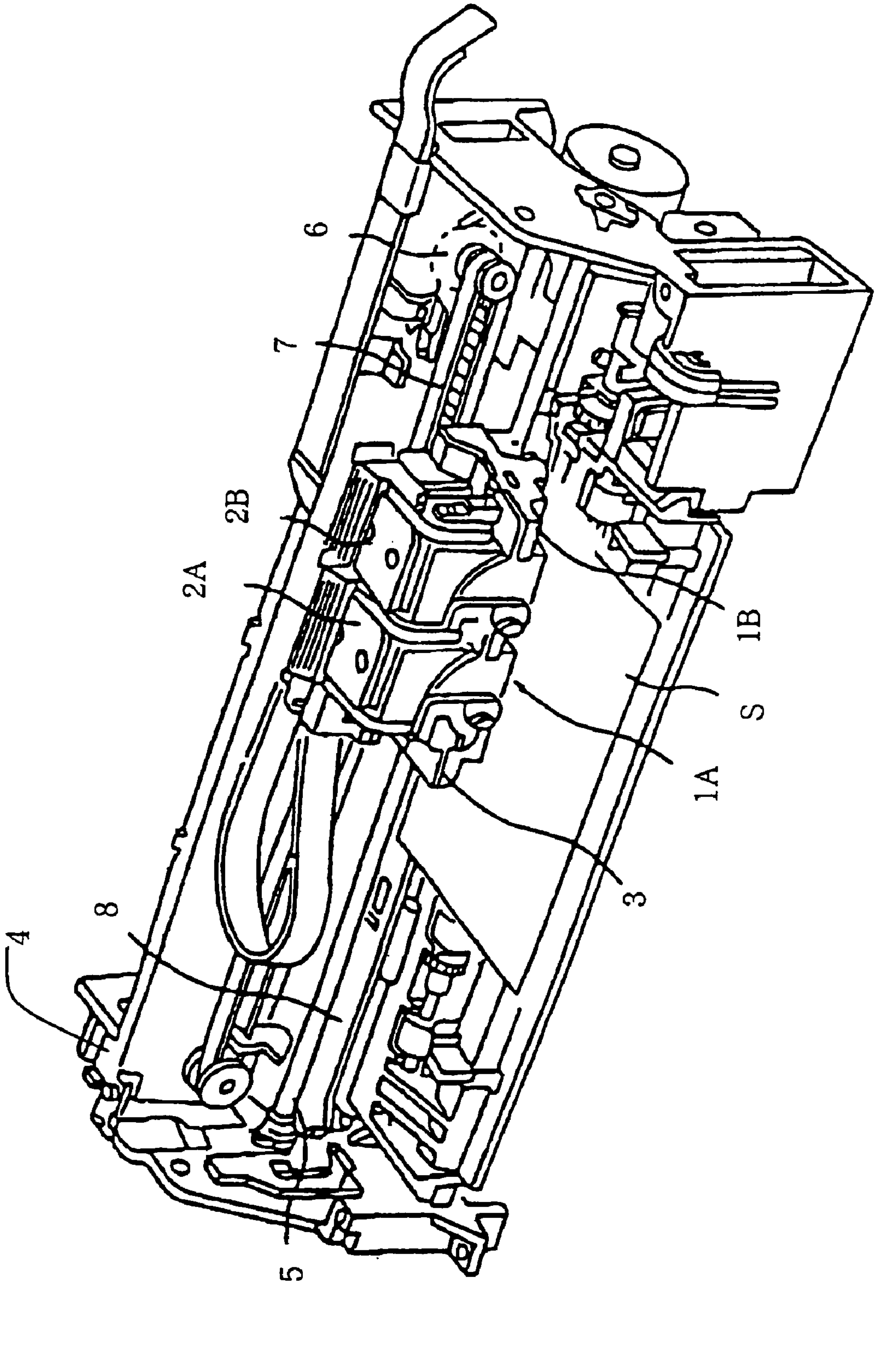
FIG. 10 is a schematic drawing of a recording device according to an embodiment of the present invention.

Here, the inkjet recording head manufactured in accordance with the above-described manufacturing method constitutes part of a recording head unit including an ink passage which communicates with an ink cartridge and the like, and is mounted on an inkjet recording device. FIG. 10 is a schematic drawing showing an example of the inkjet recording device. As shown in FIG. 10, cartridges 2A and 2B constituting ink supplying means are detachably provided to recording head units 1A and 1B including inkjet recording heads. A carriage 3 mounting these recording head units 1A and 1B is provided to a carriage shaft 5 fitted to a device body 4 as movable in the direction of the shaft. For example, these recording head units 1A and 1B are configured to eject a black ink composition and color ink compositions, respectively. Moreover, as a drive force of a drive motor 6 is transmitted to the carriage 3 through an unillustrated plurality of gears and a timing belt 7, the carriage 3 mounting the recording head units 1A and 1B is moved along the carriage shaft 5. Meanwhile, the device body 4 is provided with a platen 8 along the carriage shaft 5, and a recording sheet S as a recording medium, which is made of paper or the like and is fed by an unillustrated paper feed roller, is conveyed on the platen 8.

Embodiment 2

This embodiment is another example of the method of manufacturing an inkjet recording head, or an actuator device in particular. Specifically, although the inkjet recording head is manufactured in the same procedures as Embodiment 1 (see FIG. 3(*a*) to FIG. 5(*b*)) in this embodiment as well, but the method of manufacturing the insulation film 55 is different. Now, the method of manufacturing the insulation film 55 according to this embodiment will be described below.

To be more precise, first as similar to the above-described embodiment, the zirconium layer is formed in the thickness of about 300 nm on the elastic film 50 in accordance with the DC sputtering method, for example. Thereafter, in this embodiment, the insulation film 55 is formed by heating the passage-forming substrate wafer 110 formed with this zirconium layer up to a predetermined temperature at a predetermined rate of temperature increase by use of an RTA apparatus, for example.

The rate of temperature increase for subjecting the zirconium layer to thermal oxidation as described above is set preferably greater than or equal to 5° C./sec. Particularly, it is desirable to set a relatively fast rate greater than or equal to 50° C./sec. Moreover, it is preferable to set a density of the insulation film 55 made of zirconium oxide equal to 5 g/cm$^3$ by setting the relatively fast rate of temperature increase as described above. Here, although the method of heating the zirconium layer is not particularly limited, it is preferable to use an RTA (rapid thermal annealing) method as in this embodiment. In this way, it is possible to set the relatively fast rate of temperature increase. Meanwhile, the temperature upon thermal oxidation of the zirconium layer is set preferably in a range from 800° C. to 1000° C. In this embodiment, the temperature was set to about 900° C.

As described above, by heating and oxidizing the zirconium layer at the relatively fast rate of temperature increase, it is possible to form the insulation film 55 into a dense film, and thereby to prevent occurrence of cracks on the insulation film 55. To be more precise, it is possible to surely prevent occurrence of cracks on the insulation film 55 by setting the density of the insulation film 55 greater than or equal to 5 g/cm$^3$. Moreover, the fact that the insulation film 55 is formed into the dense film as described above also derives an effect to prevent diffusion of the lead component of the piezoelectric layer 70 made of PZT into the elastic film formed on the surface of the passage-forming substrate wafer 110 through this insulation film 55.

Here, the insulation films were formed while changing the rate of temperature increase as shown in Table 1 below upon oxidation of the zirconium layers, and a plurality of Samples 1 to 5 were fabricated by forming the piezoelectric layers made of PZT directly on these insulation layers without forming the lower electrode films. Then, with reference to these Samples 1 to 5, densities of the insulation films and depths of diffusion of the Pb components of the piezoelectric layers into the elastic films (the passage-forming substrate wafers) were investigated. The result is also shown in Table 1 below.

TABLE 1

| | Oxidation rate of temperature increase (° C./sec) | Density (g/cm$^3$) | Pb diffusion depth (nm) |
|---|---|---|---|
| Sample 1 | 0.1 | 4.13 | 60 |
| Sample 2 | 4.5 | 4.80 | 45 |
| Sample 3 | 6.0 | 5.01 | 40 |
| Sample 4 | 15.0 | 5.32 | 40 |
| Sample 5 | 19.0 | 5.37 | 40 |

As shown in Table 1 above, the density of the insulation film becomes higher in proportion to the oxidation rate of temperature increase for the zirconium layer. Moreover, it was confirmed that the increase in the density of the insulation film stopped when the density of the insulation film exceeded 5 g/cm$^3$, in other words, when the oxidation rate of temperature increase exceeded approximately 5° C./sec, and that the density of the insulation film remained almost constant even when the rate of temperature increase was set faster. For example, even when the rate of temperature increase is set to about 150° C./sec, the density of the insulation film will be almost equal to the value of Sample 5. Meanwhile, as shown in Table 1, it was confirmed that the Pb diffusion depth was reduced along with the increase in the density of the insulation film.

Moreover, as it is obvious from this result, it is possible to regulate the diffusion of the Pb component into the elastic film (the passage-forming substrate wafer) to a constant amount by setting the rate of temperature increase greater than or equal to 5° C./sec or preferably equal to 50° C./sec upon oxidation of the zirconium layer so as to control the density of the insulation film equal to or greater than 5 g/cm$^3$ as in this embodiment. Furthermore, it is possible to prevent diffusion of the Pb component into the elastic film (the passage-forming substrate wafer) reliably by setting the thickness of the insulation film equal to or greater than 40 nm.

In addition, adhesion between the insulation film 55 and the elastic film 50 is enhanced by heating the zirconium layer at the relatively fast rate of temperature increase for achieving thermal oxidation as in this embodiment. Accordingly, there is also an effect that separation of the insulation film 55 can be prevented even in the case of repetitive deformation by the drive of the piezoelectric element 300.

Figure 11:
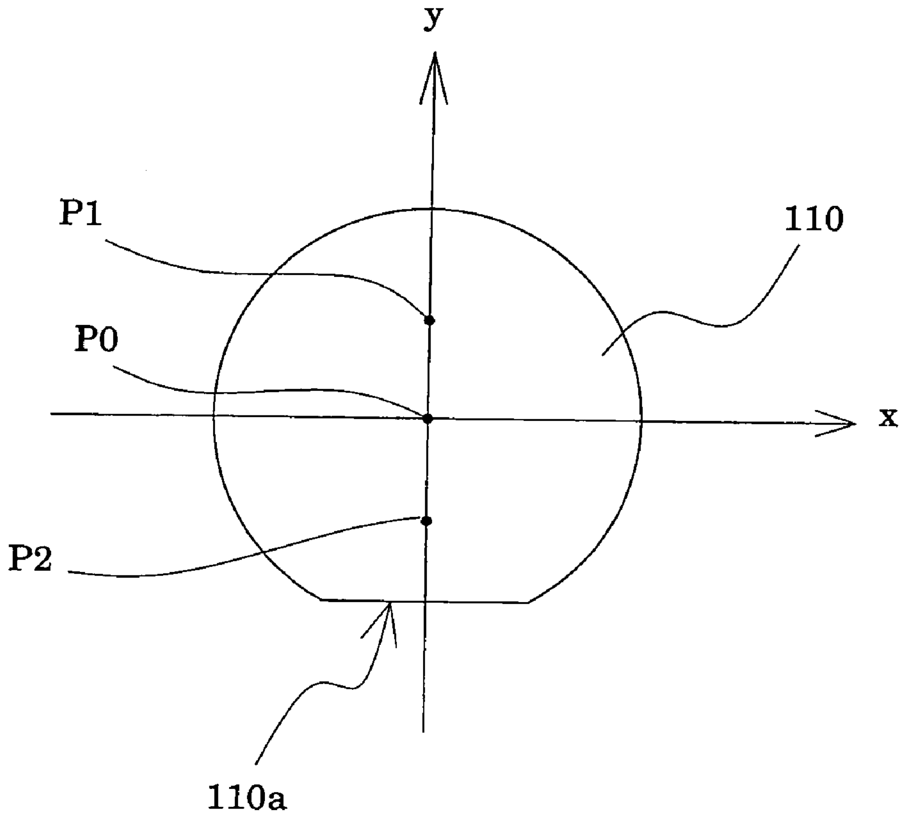
FIG. 11 is a view for explaining positions of measurement of the adhesion.
Figure 12:
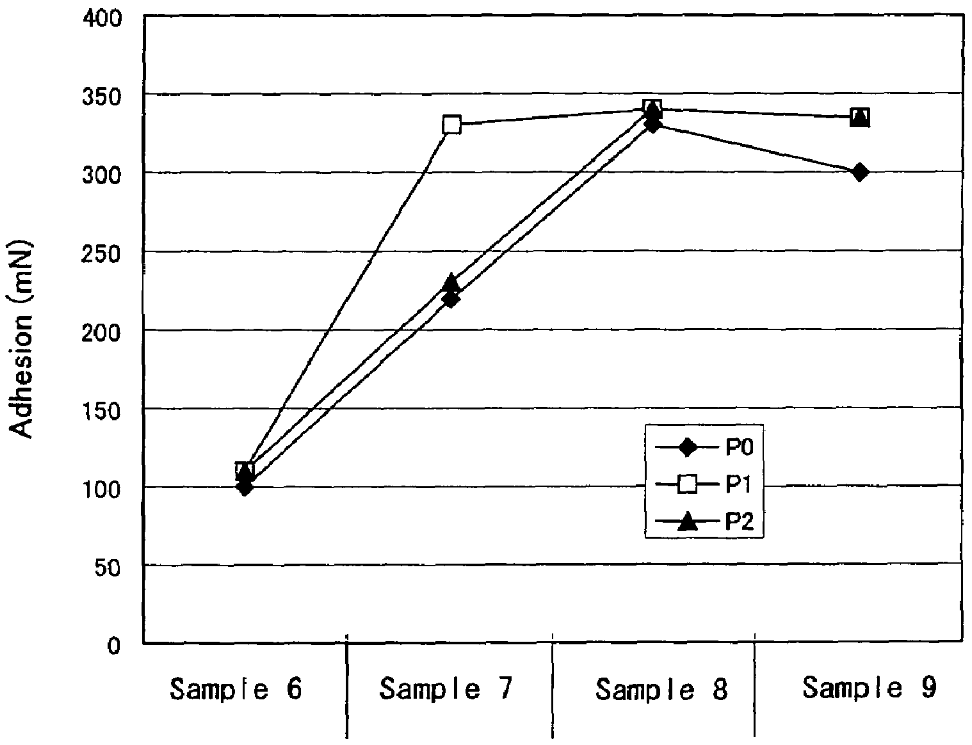
FIG. 12 is a graph showing a relation between a rate of temperature increase and the adhesion.

Here, the adhesion of the insulation film was investigated with reference to different rates of temperature increase. To be more precise, the insulation films (the zirconium oxide layers) of Samples 6 to 9 were formed by forming the zirconium layers on the elastic films, setting constant conditions except the rate of temperature increase, and subjecting the zirconium layers to thermal oxidation while setting the rate of temperature increase to 15, 50, 100, and 150° C./sec. Then, a scratch test was performed with reference to the insulation film of each of these samples. Here, as shown in FIG. 11, the scratch test was performed with reference to three points on a y axis in a perpendicular direction to an orientation flat plane 110*a* while defining the center of the passage-forming substrate wafer 110 as a reference point P0, or to be more precise, with reference to the center point P0 of the passage-forming substrate wafer 110, a position P1 which was 60 mm away from the center point on the y axis in a plus direction, and a position P2 which was 60 mm away from the center point on the y axis in a negative direction, respectively. The results are shown in FIG. 12. As shown in FIG. 12, the insulation film of Sample 6 applying the rate of temperature increase of 15° C./sec had adhesion around 100 mN. Meanwhile, adhesion around 200 mN was obtained from the insulation film of Sample 7 applying the rate of temperature increase of 50° C./sec, and extremely favorable adhesion around 300 mN was obtained from the insulation films of Sample 8 and Sample 9 applying the rate of temperature increase greater than or equal to 100° C./sec. As described above, the adhesion of the insulation film to the elastic film is increased more as the rate of temperature increase is set faster upon thermal oxidation of the zirconium layer. To be more precise, it is possible to obtain sufficient adhesion by setting the rate of temperature increase greater than or equal to 50° C./sec or more particularly greater than or equal to 100° C./sec.

Figure 13:
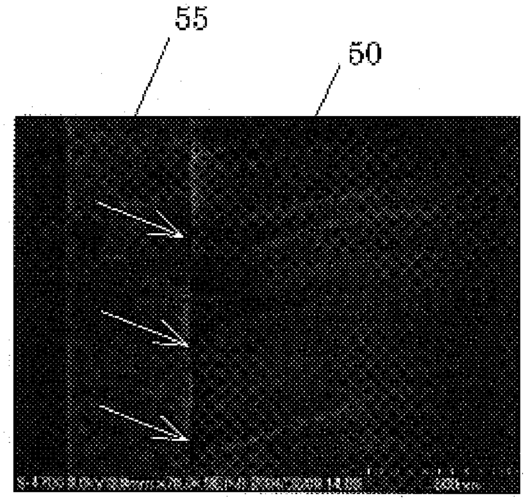
FIGS. 13(*a*) to 13(*c*) are SEM images showing cross sections of insulation films.
Figure 13:
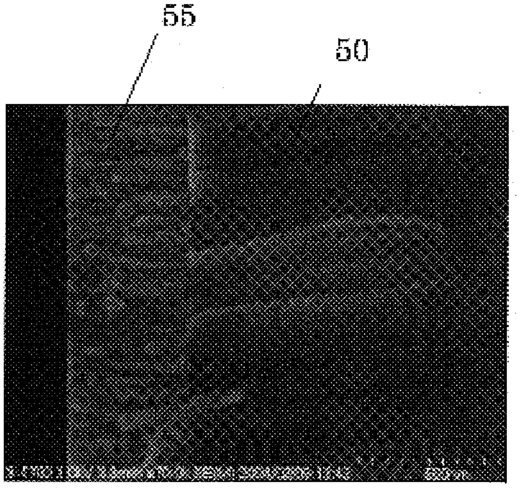
Figure 13:
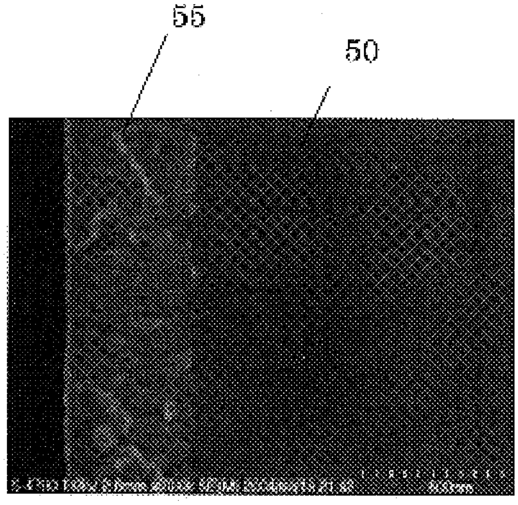

Moreover, here, cross-sectional SEM images of the insulation films 55 of Samples 10 to 12, which were obtained by subjecting the zirconium layers to thermal oxidation while setting constant conditions except the rate of temperature increase and setting the rate of temperature increase to 4, 19, and 150° C./sec, are shown in FIGS. 13(*a*) to 13(*c*). As shown in FIGS. 13(*a*) and 13(*b*), when the rate of temperature increase was set relatively slow as in the insulation films 55 of Samples 10 and 11, a low-density layer made of a glassy substance is formed on an interface between the insulation film 55 and the elastic film 50. Note that black portions observed on the interfaces between the insulation films 55 and the elastic films 50 are the low-density layers. In Sample 10, as indicated with arrows in the drawing, it is confirmed that the low-density layer apparently exists. Moreover, when this low-density layer exists, the adhesion of the insulation film 55 to the elastic film 50 is reduced. On the contrary, in the SEM image of Sample 12 applying the relatively high rate of temperature increase of 150° C./sec, the low-density layer was not confirmed at all as shown in FIG. 13(*c*).

As it is apparent from these results, in order to obtain the adhesion of the insulation film 55, it is preferable to avoid existence of the low-density layer on the interface between the elastic film 50 and the insulation film 55 by setting the relatively fast rate of temperature increase upon thermal oxidation of the zirconium layer, or to be more precise, by setting the rate greater than or equal to 50° C./sec.

Moreover, in the manufacturing method of the present invention, the insulation film 55 thus formed is further subjected to annealing at a predetermined temperature so as to adjust the stress of the insulation film 55. To be more precise, the stress of the insulation film 55 is adjusted by annealing the insulation film 55 at a temperature less than or equal to the above-described maximum temperature upon thermal oxidation of the zirconium layer, for example, at a temperature less than or equal to 900° C., and changing the conditions such as the temperature or the time period on this occasion. For example, in this embodiment, the stress of the insulation film 55 was adjusted by annealing the insulation film 55 under the conditions of the heating temperature at 850° C. and the heating time period for 1 h. The stress of insulation film 55 after thermal oxidation was compressive stress around $2.4\times10^8$. On the contrary, the stress of the insulation film 55 as a consequence of annealing became a tensile stress of around $2.94\times10^8$.

As described above, stress balance among all the films including the respective layers constituting the piezoelectric element is achieved by annealing the insulation film 55 and performing adjustment of the stress. Accordingly, it is possible to prevent separation of the film attributable to the stress, and occurrence of cracks. Moreover, it is also possible to maintain the adhesion of the insulation film 55 by setting the heating temperature for annealing less than or equal to the maximum temperature upon thermal oxidation of the zirconium layer. Here, the heating temperature for annealing is not particularly limited as long as the temperature is set less than or equal to the above-described maximum temperature. However, it is preferable to set the heating temperature as high as possible. As described above, the stress of the insulation film is determined by the conditions for annealing such as the heat temperature or the heating time period. For this reason, by setting a high heating temperature, it is possible to complete adjustment of the stress (annealing) in a relatively short time and thereby to increase manufacturing efficiency.

Figure 14:
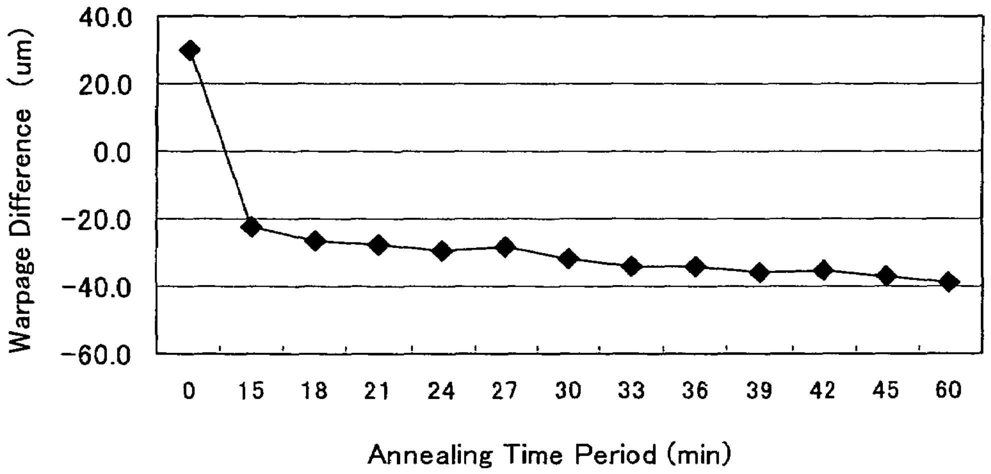
FIG. 14 is a graph showing a relation between elapsed time for annealing and stress of an insulation film.

Here, variation in the stress of the insulation film before and after annealing was investigated. To be more precise, the insulation film is formed by subjecting the zirconium layer formed on the elastic film to thermal oxidation under the conditions of the heating temperature at 900° C. and the heating time period of 5 sec. Thereafter, this insulation film is annealed under the conditions of the heating temperature at 900° C. and the heating time period of 60 min. Then, at the time of annealing, an amount of warpage of the insulation film was investigated at every predetermined elapsed time. The result is shown in FIG. 14. Note that the amount of warpage cited herein is equivalent to an amount of warpage of the insulation film at the central portion of the passage-forming substrate wafer in a span of about 140 mm.

As shown in FIG. 14, the largest amount of warpage of the insulation film before annealing was approximately equal to +30 μm. That is, warpage occurred in the insulation film before annealing so as to render the elastic film side concave. Although the amount of warpage of this insulation film varied largely for an annealing time period of about 15 min, the amount of warpage also continued to vary gradually in a negative direction thereafter. After a lapse of 60 min from annealing, the insulation film caused warpage in a maximum amount of warpage equal to about −40 μm so as to render the elastic film side convex. As is apparent from this result, the stress of insulation film 55 varies depending on the time period for annealing. Therefore, by controlling the time period for annealing the insulation film, it is possible to adjust the insulation film 55 to a desired stress condition. Of course, the stress of the insulation film can be adjusted not only by controlling the time period for annealing but also by controlling the temperature.

Here, it is also conceivable to perform stress adjustment of the insulation film by annealing at the time of sintering the piezoelectric layer. For example, the stress of the insulation film can be adjusted by modifying conditions such as a sintering temperature for the piezoelectric layer 70. However, modification of the conditions such as the sintering temperature for the piezoelectric layer is not favorable because physical properties of the formed piezoelectric layer may be changed, and it may be difficult to obtain desired characteristics.

Moreover, it is also possible to reduce unevenness in the adhesion of the insulation film in an in-plane direction of the passage-forming substrate wafer by annealing as described above. Here, unevenness in the adhesion was investigated with reference to the insulation films of Comparative Examples without annealing and with reference to the insulation films of Examples which are subjected to annealing. To be more precise, a plurality of samples (Comparative Examples 1A, 1B, and 1C) in which the insulation films were formed on the elastic films by thermal oxidation under the above-described conditions, and a plurality of samples (Examples 1A, 1B, and 1C) in which the insulation films were further subjected to annealing after thermal oxidation were fabricated. Then, a scratch test was performed on the insulation film with reference to each of the samples according to the respective Examples and Comparative Examples. Here, as described previously, the scratch test was performed with reference to the three points on the passage-forming substrate wafer 110 (see FIG. 11). The result is shown in FIG. 15 and FIG. 16.

Figure 15:
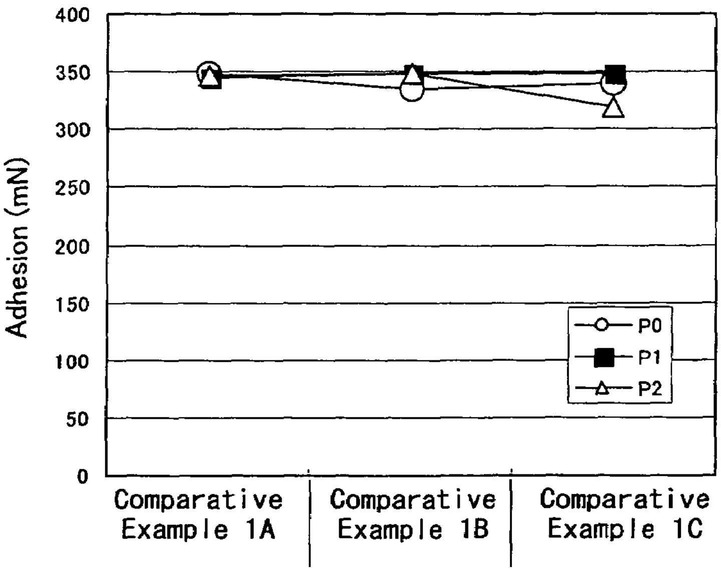
FIG. 15 is a graph showing unevenness in adhesion of insulation films according to comparative examples.
Figure 16:
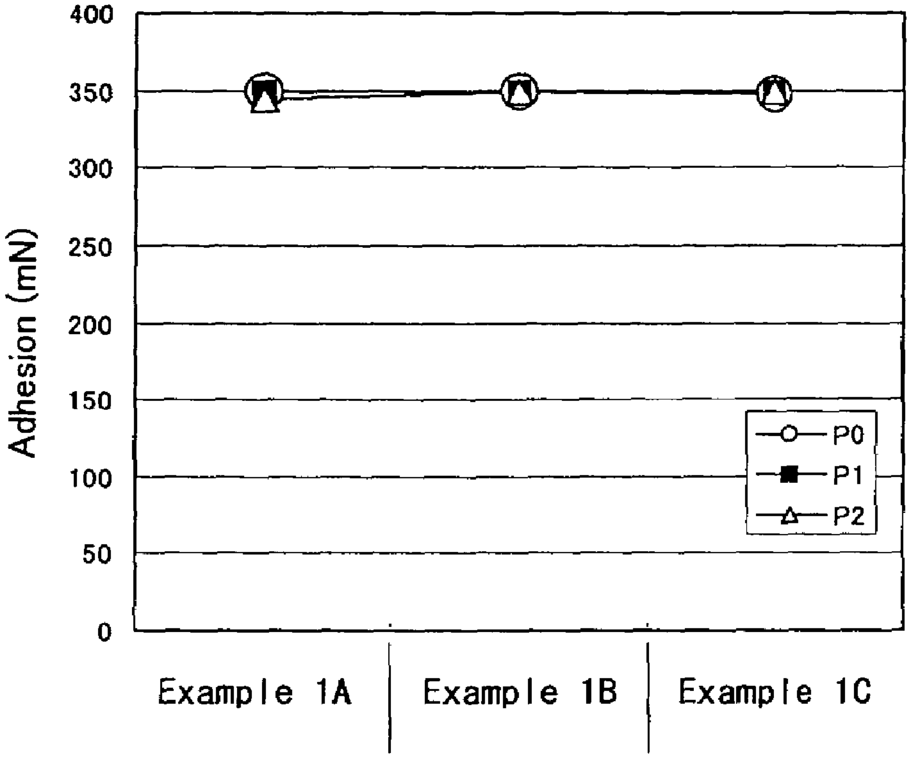
FIG. 16 is a graph showing unevenness in adhesion of insulation films according to examples.

As shown in FIG. 15 and FIG. 16, in the samples of Comparative Examples 1A to 1C, there was a difference in the adhesion of the insulation films, which was approximately equivalent to 30 mN at the maximum. On the contrary, in the samples of Examples 1A to 1C, there was very little difference in the adhesion of the insulation films. As it is apparent from this result, it is possible to prevent unevenness in the adhesion of the insulation film with reference to the in-plane direction of the passage-forming substrate wafer by forming the insulation film by thermal oxidation and further subjecting the insulation film to annealing. Moreover, it is also possible to minimize unevenness in the adhesion of the insulation films among the respective passage-forming substrate wafers.

Other Embodiments

The embodiments of the present invention have been described above. It is to be noted, however, that the present invention is not limited only to the above-described embodiments. For example, the insulation film 55 is formed on the elastic film 50 in the above-described embodiments. However, the insulation film 55 only needs to be formed closer to the piezoelectric layer 70 than the elastic film 50. For example, another layer may be provided between the elastic layer 50 and the insulation layer 55. Moreover, in the above-described embodiments, the present invention has been described on the liquid-jet head or namely the inkjet recording head, which is configured to be mounted on the liquid-jet apparatus and to include the actuator device as the liquid ejecting means as an example. However, the present invention is targeted for a wide range of actuator devices at large, and is by all means applicable to liquid-jet heads for injecting liquids other than the ink. Here, other liquid-jet heads may include various recording heads used in image recording devices such as printers, color material injection heads used for manufacturing color filters of liquid crystal displays and the like, electrode material injection heads used for forming electrodes of organic EL displays, FEDs (plane emission displays), and the like, living organic material injection heads used for manufacturing biochips, for example. Moreover, the present invention is applicable not only to the actuator device to be mounted on the liquid-jet head, but also to actuator devices to be mounted on all kinds of devices. In addition to the above-described liquid-jet heads, other devices for mounting the actuator devices may include sensors, for example.

The invention claimed is:

1. A method of manufacturing an actuator device comprising:

forming a vibration plate above one surface of a substrate; and forming a piezoelectric element comprising a lower electrode, a piezoelectric layer, and an upper electrode above the vibration plate, wherein the forming the vibration plate comprises:

forming an insulation film comprising zirconium oxide by forming a zirconium layer above the one surface of the substrate and subjecting the zirconium layer to thermal oxidation while heating the zirconium layer up to a predetermined temperature at a predetermined rate of temperature; and adjusting stress of the insulation film by annealing the insulation film at a temperature less than or equal to a maximum temperature in the thermal oxidation of the zirconium layer.

2. The method of manufacturing an actuator device according to claim 1, wherein the rate of the temperature increase upon the thermal oxidation of the zirconium layer is set greater than or equal to 5° C./sec.

3. The method of manufacturing an actuator device according to claim 2, wherein the rate of the temperature increase upon the thermal oxidation of the zirconium layer is set greater than or equal to 50° C./sec.

4. The method of manufacturing an actuator device according to claim 3, wherein the zirconium layer is heated by a rapid thermal annealing (RTA) method upon the thermal oxidation of the zirconium layer.

5. The method of manufacturing an actuator device according to claim 2, wherein a density of the insulation film is set greater than or equal to 5.0 g/cm$^3$ in the forming the insulation film.

6. The method of manufacturing an actuator device according to claim 5, wherein a film thickness of the insulation film is set greater than or equal to 40 nm in the forming the insulation film.

7. The method of manufacturing an actuator device according to claim 1, wherein a temperature upon the thermal oxidation of the zirconium layer is set in a range from 800° C. to 1000° C.

8. The method of manufacturing an actuator device according to claim 7, wherein a temperature upon the annealing the insulation film is set in a range from 800° C. to 900° C.

9. The method of manufacturing an actuator device according to claim 8, wherein a time period for the annealing the insulation film is adjusted in a range from 0.5 hours to 2 hours.

* * * * *